(12) United States Patent
Moffatt

(10) Patent No.: US 9,376,731 B2
(45) Date of Patent: Jun. 28, 2016

(54) MAGNETO-THERMAL PROCESSING APPARATUS AND METHODS

(71) Applicant: Stephen Moffatt, St. Brelade (JE)

(72) Inventor: Stephen Moffatt, St. Brelade (JE)

(73) Assignee: APPLIED MATERIALS, INC., Santa Clara, CA (US)

( * ) Notice: Subject to any disclaimer, the term of this patent is extended or adjusted under 35 U.S.C. 154(b) by 481 days.

(21) Appl. No.: 13/864,959

(22) Filed: Apr. 17, 2013

(65) Prior Publication Data

US 2013/0300040 A1 Nov. 14, 2013

Related U.S. Application Data

(60) Provisional application No. 61/643,926, filed on May 8, 2012, provisional application No. 61/647,824, filed on May 16, 2012.

(51) Int. Cl.
*C21D 9/00* (2006.01)
*B23K 26/00* (2014.01)
*H01L 21/268* (2006.01)

(52) U.S. Cl.
CPC ........... *C21D 9/0006* (2013.01); *B23K 26/0081* (2013.01); *H01L 21/268* (2013.01)

(58) Field of Classification Search
CPC . H01L 21/268; C21D 9/0006; B23K 26/0081
See application file for complete search history.

(56) References Cited

U.S. PATENT DOCUMENTS

| 6,724,652 | B2 | 4/2004 | Deak |
| 6,825,101 | B1 | 11/2004 | Hawryluk et al. |
| 2003/0146953 | A1* | 8/2003 | Gailus ................ B41J 2/16517 347/34 |
| 2004/0084679 | A1* | 5/2004 | Nakayama .......... H01L 21/2026 438/487 |
| 2005/0145845 | A1* | 7/2005 | Jyumonji ............... B23K 26/04 438/157 |
| 2007/0059949 | A1* | 3/2007 | Yamazaki ............ B23K 26/034 438/795 |
| 2008/0014685 | A1* | 1/2008 | Govorkov .......... B23K 26/0613 438/150 |
| 2008/0210671 | A1* | 9/2008 | Jennings ............ B23K 26/0613 219/121.76 |
| 2010/0065547 | A1 | 3/2010 | Moffatt et al. |
| 2011/0211428 | A1 | 9/2011 | Batra et al. |

FOREIGN PATENT DOCUMENTS

EP 0622791 A1 11/1994
JP 2004-039890 A * 2/2004 ............ H01L 21/268

(Continued)

OTHER PUBLICATIONS

Machine translation of Japan Patent document No. 2004-039,890, Sep. 2015.*

(Continued)

*Primary Examiner* — Geoffrey S Evans
(74) *Attorney, Agent, or Firm* — Patterson & Sheridan, LLP

(57) ABSTRACT

An apparatus is disclosed for magneto-thermal processing of substrates comprises a work surface for supporting a substrate for processing, a source of electromagnetic radiation that delivers an intense electromagnetic field to an area of a substrate disposed on the work surface, and a magnetic assembly that delivers a magnetic field to the area of the substrate. The intense electromagnetic field typically has an energy density of at least about 0.2 J/cm² and a cross-sectional area typically not more than about 10 cm². The magnetic field typically has a strength at least about 0.5 T and an area not more than about 10 cm².

16 Claims, 6 Drawing Sheets

(56) References Cited

FOREIGN PATENT DOCUMENTS

| WO | 0051505 | A1 | 9/2000 |
| WO | 2010120725 | A2 | 10/2010 |

OTHER PUBLICATIONS

International Search Report and Written Opinion dated Aug. 23, 2013 for International Application No. PCT/US2013/037639; 10 pages.

* cited by examiner

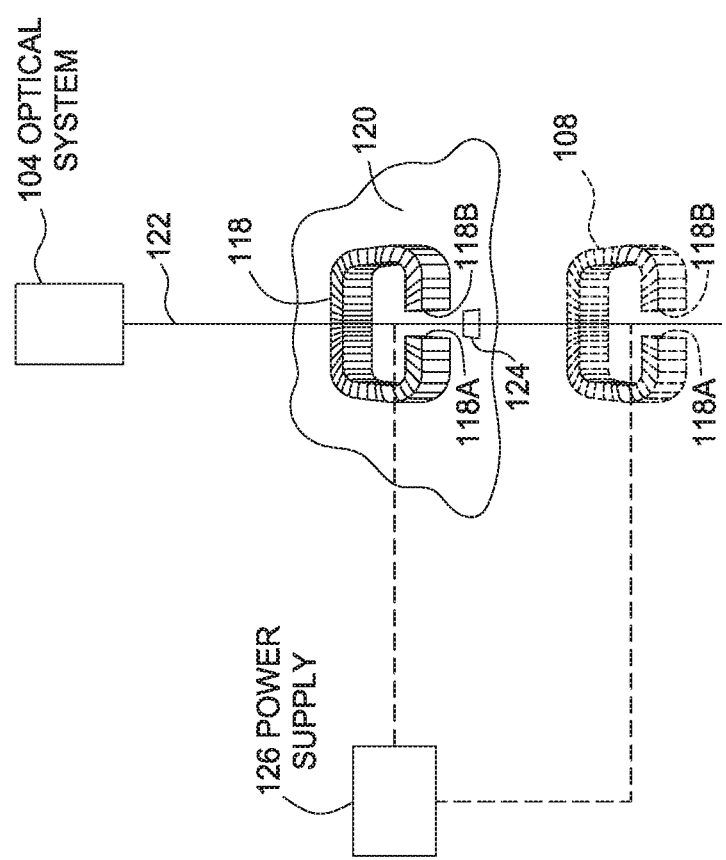

US 9,376,731 B2

MAGNETO-THERMAL PROCESSING APPARATUS AND METHODS

CROSS-REFERENCE TO RELATED APPLICATIONS

This application claims benefit of U.S. Provisional Patent Application Ser. No. 61/643,926, filed May 8, 2012, and U.S. Provisional Patent Application Ser. No. 61/647,824, filed May 16, 2012, both of which are incorporated herein by reference.

FIELD

Embodiments described herein relate to apparatus and methods of annealing substrates. More specifically, apparatus and methods described herein relate to magneto-thermal treatment of substrates.

BACKGROUND

Magnetic media are increasingly used for storing information according to a pattern of magnetic fields in a material on a substrate. Well-known examples include hard disk drives for computers, which store information on a rotating disk with a magnetic material with domains that are separately addressable to change a magnetic property of each domain according to the information to be stored, and MRAM, magnetoresistive random access memory, which stores information in cells defined by addressable magnetic domains whose polarity can be changed according to the information to be stored.

Magnetic media are generally made by depositing a layer of material having magnetic properties that may be easily changed through exposure to electric fields, magnetic fields, or electromagnetic fields. Domains are typically formed consisting of a low coercivity material surrounded by a higher coercivity material, so the magnetic properties in the domains of low coercivity may be readily changed. In this way, the polarity of a domain may be distinguished from that of its neighbor, and information can be stored and retrieved.

The substrates may be any structurally sound material, such as glass, aluminum, or plastic. The magnetic materials are generally metal alloys including metals such as cobalt, platinum, iron, manganese, nickel, chromium, vanadium, and the like. The magnetic material is often sputtered onto the substrate, sometimes over another material of high magnetic permeability, such as molybdenum or so-called "mu metal" to shield the magnetic pattern from the influence of other magnetic field sources nearby.

For some magnetic media, orientation of the magnetic domains is needed after they are formed. For example, to initialize an MRAM device to a null state, all the magnetic memory elements of the device must be aligned to the null state. Such alignment typically requires that the device be exposed to a magnetic field, usually with heat to increase mobility of the domains. Such processing is commonly done by disposing a batch of substrates having magnetic media surfaces in a furnace coupled to a large magnet. As the substrates are heated to a suitable mobility temperature, for example above the Curie temperature, a magnetic field is established within the chamber to align the magnetic domains of the substrates. The magnetic field strength typically used is above 0.5 T and sometimes as high as 10 T. Electromagnets are normally used, and superconducting magnets are normally used for the high field strengths. The magnets currently used are massive, requiring large power budgets and footprints to generate the fields needed. Such apparatus are quite expensive, and the furnaces employing such methods typically have low throughput preventing them from being commercially viable.

Thus, there is a continuing need for new apparatus and methods for magneto-thermal processing of substrates.

SUMMARY

An apparatus is disclosed for magneto-thermal processing of substrates comprises a work surface for supporting a substrate for processing, a source of electromagnetic radiation that delivers an intense electromagnetic field to an area of a substrate disposed on the work surface, and a magnetic assembly that delivers a magnetic field to the area of the substrate. The intense electromagnetic field typically has an energy density of at least about 0.2 J/cm$^2$ and a cross-sectional area typically not more than about 10 cm$^2$. The magnetic field typically has a strength at least about 0.5 T and an area not more than about 10 cm$^2$.

The electromagnetic energy may be pulsed or continuous laser or LED energy from one or a plurality of laser or LED sources. The magnetic field is substantially parallel or substantially perpendicular to the work surface. The magnetic assembly may comprise a magnet with a first magnetic pole proximate a first side of the work surface and a second magnetic pole proximate a second side of the work surface opposite the first side of the work surface. Alternately, the magnetic assembly may comprise a first magnet with two magnetic poles proximate the first side of the work surface and a second magnet with two poles proximate the second side of the work surface.

The magnetic assembly directs magnetic force through a treatment zone of the substrate while the electromagnetic energy is incident on the treatment zone of the substrate.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1B is a perspective view of a portion of the magneto-thermal processing apparatus of FIG. 1A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
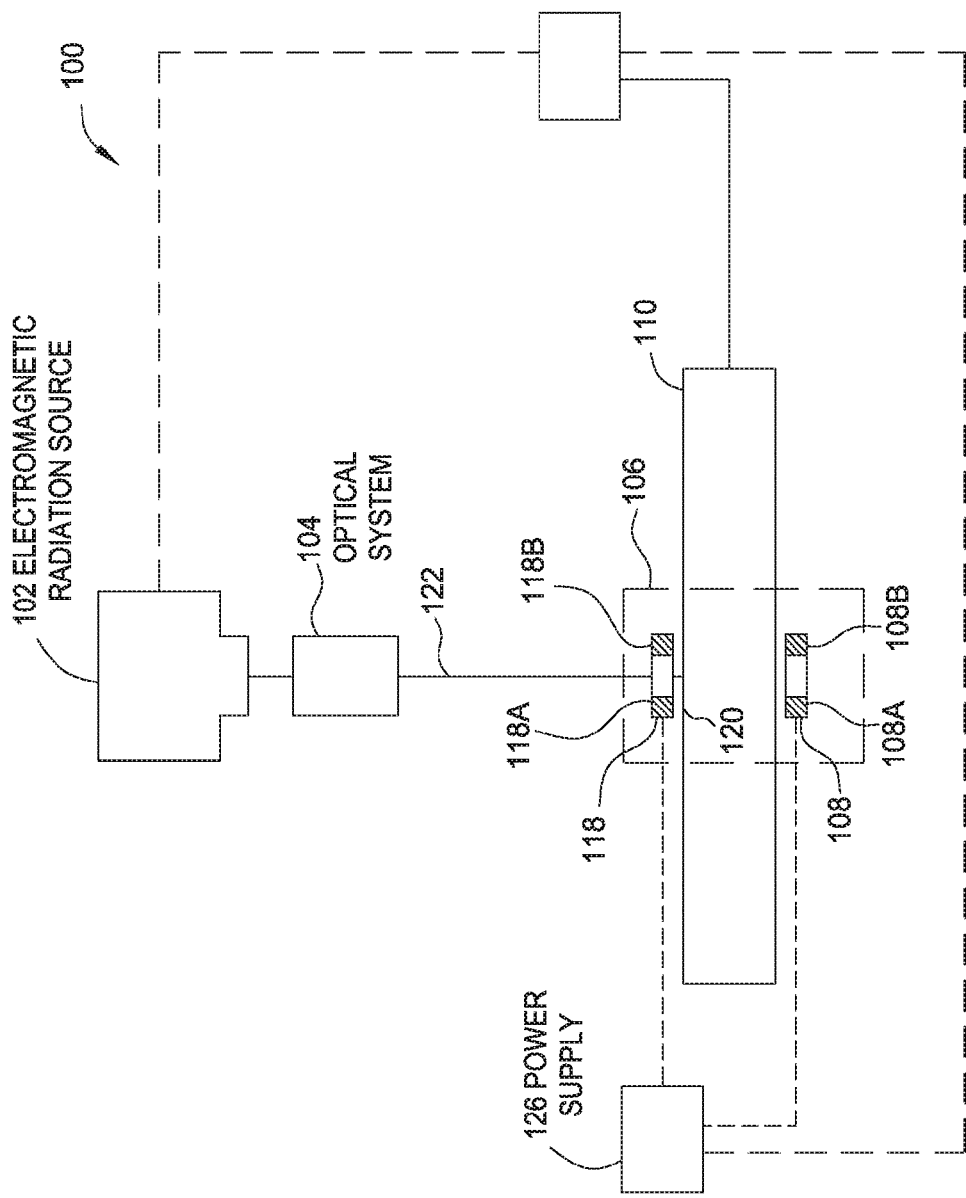
FIG. 1A is a schematic side view of a magneto-thermal processing apparatus according to one embodiment.

FIG. 1A is a schematic side view of a magneto-thermal processing apparatus 100 according to one embodiment. The apparatus 100 comprises a source of electromagnetic radiation 102, an optical system 104, a magnetic assembly 106, and a substrate support 110 with a work surface 120 on which a substrate may be positioned for processing. The magnetic assembly 106 comprises a first magnet 118, with a first magnetic pole 118A and a second magnetic pole 118B, and a second magnet 108, with a first magnetic pole 108A and a second magnetic pole 108B. Each of the first and second magnets 108 and 118 is positioned with the magnetic poles 118A/B and 108A/B proximate opposite sides of the work surface 120 such that the first magnet 118 is proximate a first side of the work surface 120 and the second magnet 108 is proximate a second side of the work surface 120 opposite the first side of the work surface 120. Thus, the magnets 118 and 108 are positioned on opposite sides of a substrate disposed on the work surface 120 for processing.

The source of electromagnetic radiation 102 emits a beam 122 of electromagnetic energy toward the substrate support 110. The beam 122 of energy is typically designed to raise the temperature of a portion of a substrate disposed on the work surface 120 of the substrate support 110 to a temperature that anneals the portion of the substrate exposed to the beam 122. The beam 122 typically has a cross-sectional power distribution of at least about $10^5$ W/cm$^2$, and may be a continuous or semi-continuous beam scanned with respect to a substrate or a pulsed beam delivering pulses of energy to successive treatment zones of the substrate. In a continuous embodiment, a beam having the power distribution above may be scanned with respect to the substrate at a linear rate of about 1 m/sec to deliver at least 0.2 J/cm$^2$ of energy to each location of the substrate, or a nanosecond pulse having power of at least 10 MW may deliver energy of at least 0.2 J/cm$^2$ to each treatment zone. The beam 122 may have any cross-sectional shape, but will typically have a cross-sectional area of not more than about 10 cm$^2$. The beam 122 may have a cross-sectional shape that is circular, oval, rectangular, square, polygonal, or irregular.

The energy emitted by the source of electromagnetic radiation 102 may be laser energy, intense LED light, or microwave energy, or a combination thereof. The optical system 104 generally modifies the shape, uniformity, overall intensity, spectral distribution, and any other desired quality of the energy. Exemplary electromagnetic radiation sources and optical apparatus that may be used to deliver pulses of laser energy are disclosed in U.S. patent application Ser. No. 13/194,552, filed Jul. 29, 2011, and United States Patent Publication 2009/0032511, both of which are incorporated herein by reference.

The substrate support 120 is movable in three orthogonal directions, one direction parallel to a direction of propagation of the electromagnetic radiation, and two directions perpendicular to the direction of propagation of the electromagnetic radiation and perpendicular to each other. Such substrate supports are well-known within the thermal processing industry, and are commonly capable of precisely positioning a substrate on the work surface 120 with respect to the source of electromagnetic energy 102 such that the electromagnetic energy.

The magnetic poles 118A and 118B of the magnet 118 create a magnetic field that traverses the space between the poles 118A/B in a direction substantially parallel to the work surface 120. A distance from the magnetic poles 118A/B to the work surface 120 is selected to facilitate projecting the magnetic field onto the work surface 120 such that a substrate disposed on the work surface 120 may be subjected to an intense magnetic field at a portion of the substrate being treated. The magnet 108 is likewise positioned to project an intense magnetic field onto substantially the same portion of the work surface 120 such that the full thickness of the substrate is immersed in the intense magnetic field at the treatment portion of the substrate.

The magnets 118 and 108 are typically small compared to the size of a substrate on the work surface, or the size of the work surface 120. In one embodiment, the work surface 120 has dimensions of about 18 inches square, while a linear dimension of the magnets 118 and 108, for example a diameter thereof, is about 2 inches. The magnets 118 and 108 may be the same size or different sizes, depending on the distribution of magnetic energy desired, which may be between about 1 inch and about 12 inches, such as between about 2 inches and about 8 inches. The magnets 118 and 108 may be any convenient size, and larger magnets will support more intense magnetic fields for a given pole spacing. Larger magnets will also consume more power. The magnets may have any shape convenient for producing a small-area magnetic field near the work surface 120. The magnets 118 and 108 are substantially circular in shape, but any shape that supports a strong magnetic flux, for example a horseshoe shape, a rectangular shape, a trapezoidal shape, or an irregular curved, polygonal, or segmented shape may be used.

FIG. 1B is a perspective view of the magnets 118 and 108 positioned on either side of the work surface 120. The magnetic poles 118A and 118B are separated by a gap 160 that permits applying a magnetic field to the work surface 120, and to a substrate that may be positioned on the work surface 120 for processing. A similar gap 162 between the magnetic poles 108A and 108B allows a similar magnetic field to be applied to the work surface 120. The two fields combined to produce a uniform magnetic field throughout a processing zone 124, and a corresponding area of a substrate positioned on the work surface 120. The gap 160 also permits propagation of radiation 122 from the source 104 to the processing zone 124 through the magnetic field maintained there.

The gaps 160 and 162 may be the same size or different sizes. In most embodiments, the gaps 160 and 162 will be the same size. In some embodiments, however, the gap 162 may be larger or smaller than the gap 160. The gaps 160 and 162 may be different sizes in one or two orthogonal dimensions. The gap 160 is generally larger than the processing zone 124, such that the radiation 122, which is typically a beam of radiation shaped to fill the processing zone 124 with a field of uniform intense radiation, may pass through the gap 160 without impacting either of the magnetic poles 118A or 118B. The processing zone 124 is typically a square or rectangular region with areal coverage up to about 10 cm$^2$, such as between about 3 cm$^2$ and about 8 cm$^2$, for example about 5 cm$^2$. A space between a border of the processing zone 124 closest to a corresponding magnetic pole 118A or 118B is typically less than about 10 mm, such as between about 2 mm and about 8 mm, for example about 3 mm. Increasing the size of the gap 160 increases the volume of the magnetic field both due to the larger distance between the magnetic poles 118A and 118B and due to a larger divergence or curvature of the magnetic field between the two poles. The larger divergence allows exposure of a greater area of the processing zone 124 to the magnetic field, but also lowers the overall flux density of the field that impacts the processing zone 124. For this reason, a magnet having a larger pole gap 160 may have a larger, more massive, or more permeable magnetic circuit, may have more coil turns to intensify the magnetic field, and/or may have more power applied to the coil.

Each of the magnets 108 and 118 are shown with a single conductive coil, but in alternate embodiments, each magnet may have multiple coils to reduce resistive power losses. A magnet may have two, three, four, or more coils, each of which may have an independent power supply 126 enabling independent delivery of desired power levels to the individual coils of a magnet. Such capabilities may be useful in some embodiments for managing reluctance in the magnetic circuit.

Figure 1C:
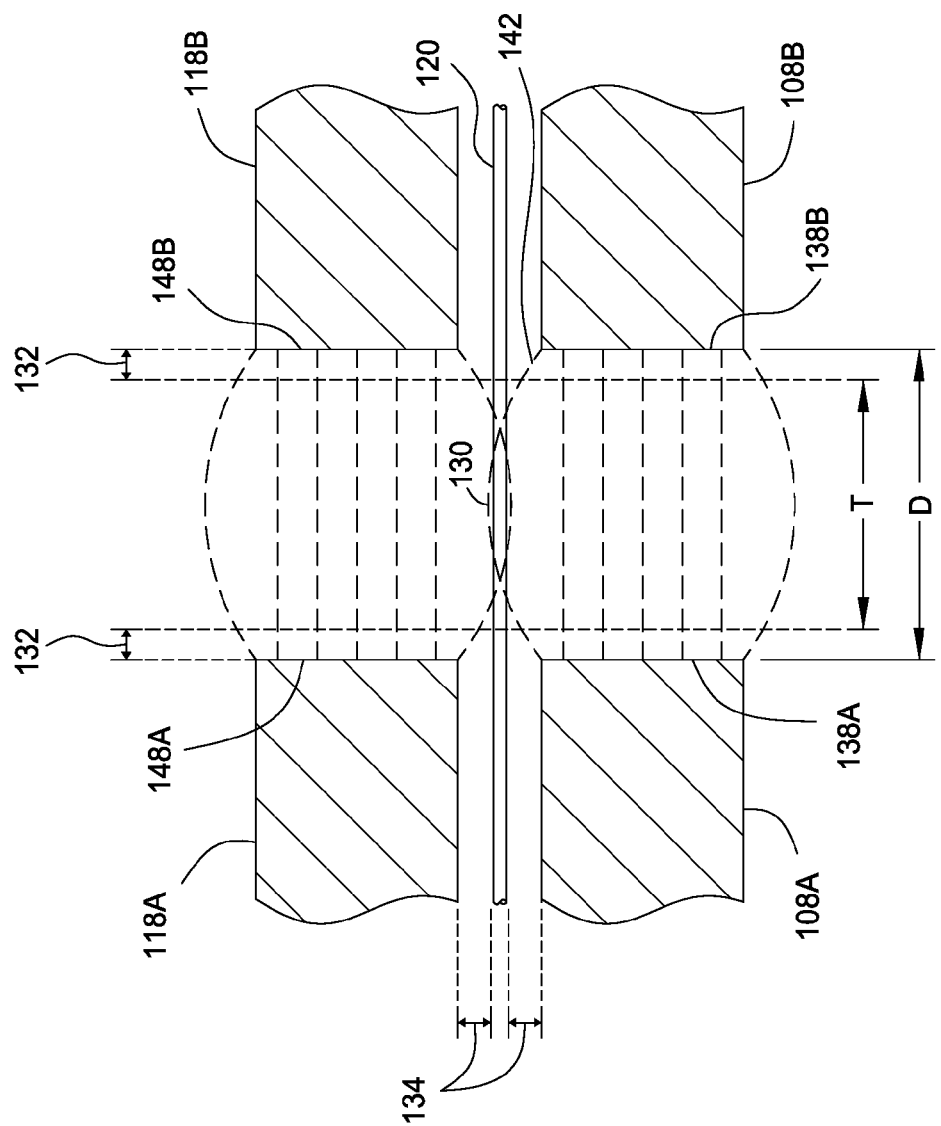
FIG. 1C is detailed view of a portion of the magneto-thermal processing apparatus of FIG. 1A.

FIG. 1C is a close side view of the apparatus of FIG. 1A. The poles 118A and 118B, and the poles 108A and 108B, are typically spaced apart a distance D that is larger than the size T of the treatment zone 130 to be exposed to the magnetic field. In one embodiment, the area of the treatment zone 130 is no larger than about 10 cm$^2$, and has a substantially square shape, so the poles 118A and 118B are spaced apart about 3.5 cm.

Each of the poles 118A/B and 108A/B has a face 148A/B and 138A/B, respectively, that is typically spaced apart from a boundary of the treatment zone a short distance 132, which may be between about 1 mm and about 10 mm, such as between about 2 mm and about 6 mm, for example about 3 mm. The spacing 132 for each face may be the same or different from that of any of the other faces. The faces 148 and 138 of the poles may all be planar or non-planar, parallel or non-parallel. Non-parallel faces may be used, for example, to project magnetic field lines toward the work surface 120.

Figure 1D:
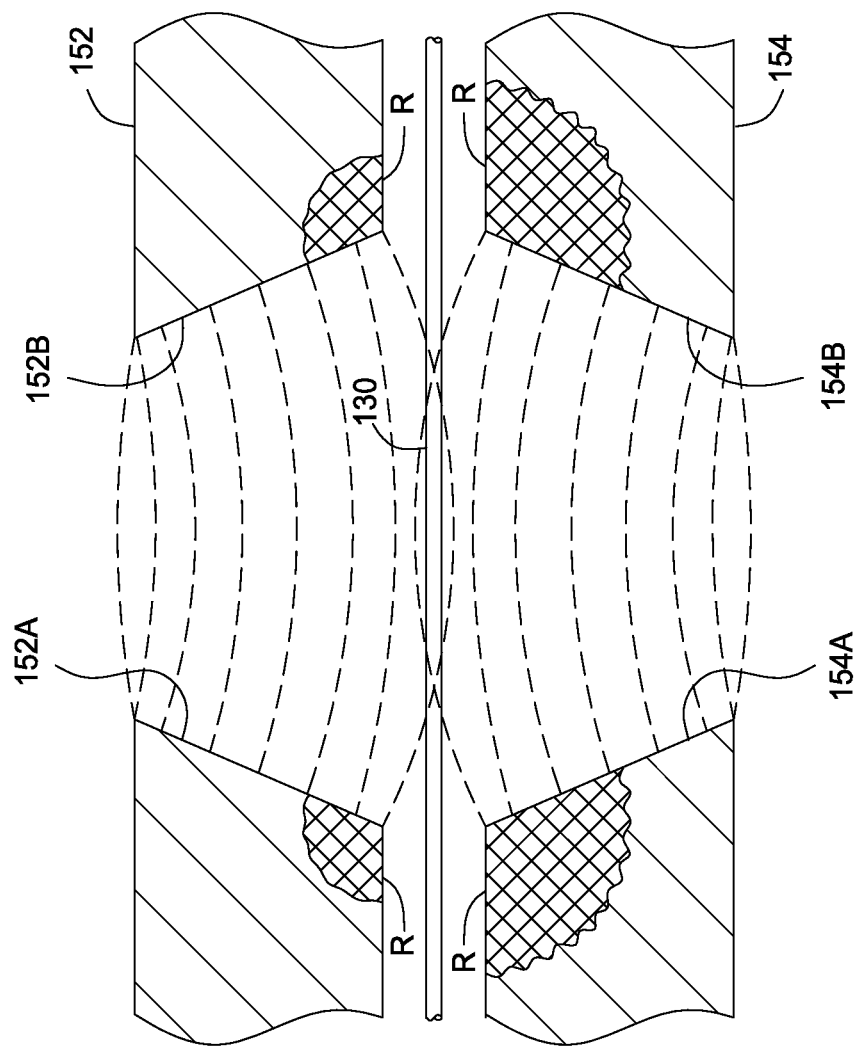
FIG. 1D is a detailed view of a magneto-thermal processing apparatus according to another embodiment.

The magnetic field 140 produced by the magnetic poles 118A/B and 108A/B may be substantially uniform in intensity, such that the energy density of the magnetic field maintained inside the substrate within the treatment zone 130 is substantially uniform. The magnetic field 140 has a fringe area 142 produced near extremities of the faces 148 and 138. In some embodiments, the magnet may be adjusted to provide a non-uniform magnetic field that has enhanced intensity in the fringe area 142. In some embodiments, the faces 148 and 138 may be curved or angled toward the work surface 120 according to any desired parameters to project magnetic field lines, and therefore magnetic field energy density, toward the work surface such that a higher magnetic field intensity may be maintained within the substrate in the treatment zone 130. FIG. 1D shows an embodiment with pole faces 148 and 138 that have bevels designed to direct magnetic field lines toward the work surface.

Each of the poles 118A/B and 108A/B has a surface face with a perimeter that may be any convenient shape, such as square, round, circular, semicircular, rectangular, triangular, polygonal, or irregular. To increase uniformity of the magnetic field applied to a substrate on the work surface 120, the perimeter of the poles 118A/B and 108A/B are preferably parallel to the work surface 120 where the edge of the poles 118A/B and 108A/B is nearest the work surface 120. In other words, the poles 118A/B and 108A/B may each have a flat edge proximate the work surface 120. Uniformity of the magnetic field across the treatment zone 130 is promoted by a perimeter of the pole faces 118A/B and 108A/B that is substantially parallel to the work surface 120. The pole faces 118A/B and 108A/B may be shaped, if desired, to enhance uniformity or intensity of the magnetic field at the work surface 120 in the treatment zone 130. For example, the uniformity of the magnetic field may be measured in the treatment zone 130 of the work surface 120 using an array of magnetic sensors, and the pole faces 118A/B and 108A/B sculpted based on the observed uniformity. The array of magnetic sensors may be mounted on a test substrate, if convenient.

The fringe field 142 has a component near a peripheral region of the treatment zone 130 that is curved due to convergence of magnetic field lines toward the poles 118A/B and 108A/B. In some embodiments, it may be useful to manage the curvature of the field lines to minimize the area of the treatment zone 130 subject to a substantially non-parallel magnetic field. This may be accomplished by enlarging the distance D such that the areas of high field curvature remain outside the treatment zone 130. Alternately, the poles 118A/B and 108A/B may be shaped to reduce divergence of the magnetic field lines between the poles 118A/B and 108A/B or to reduce a radius of curvature of the field lines near the poles 118A/B and 108A/B such that the field lines assume a substantially parallel orientation closer to the poles 118A/B and 108A/B. Convex pole faces broaden the area covered by the fringe field 142 so that curvature of the fringe field 142 may be located outside the treatment zone.

The fringe field 142 represents the fraction of the total magnetic energy that is usable. The fringe field 142 is the portion of the magnetic field that is disposed within the treatment area 130 so that a substrate positioned on the work surface 120 may be processed by the magnetic energy of the fringe field 142. In most embodiments, at least 10% of the energy of the magnetic field between each of the magnets 108 and 118 is usable. Some embodiments may have up to 25% usable fringe field magnetic energy. In embodiments wherein the magnets 118 and 108 and/or the pole faces 118A/B and 108A/B are shaped to increase the intensity of the fringe field 142, curvature of the fringe field 142 may be increased, resulting in more non-parallelism of the fringe field 142. In such embodiments, the distance D may be increased to compensate for some non-parallelism. Embodiments wherein the magnet is shaped to increase uniformity and/or parallelism of the fringe field 142 may have a lower proportion of usable magnetic energy. For example, convex pole faces may broaden the coverage of the fringe field 142 such that the curved edge portions of the fringe field 142 are outside the treatment zone 130.

The distance 134 of the magnetic poles 118A/B and 108A/B from the work surface is typically a small fraction of the height of the poles 118A/B and 108A/B to allow as much fringe field 142 as possible to penetrate a substrate positioned on the work surface 120. Typical clearance between the magnets 108 and 118 and the work surface 120 is between about 0.5 mm and about 3 mm. Curvature of the fringe field 142 may also be compensate to a certain degree by adjusting the distance 134. For example, increasing the distance 134 may subject the work surface to less of the highly curved edge region of the fringe field 142. It should be noted that the distance between the work surface 120 and a magnet 118 may be larger on the side of the work surface 120 on which a substrate is positioned, since the target location for maximum fringe field intensity and uniformity will be located adjacent to the work surface 120 on that side. The distance 134 on the opposite side of the work surface 120 from the side on which the substrate is positioned may be correspondingly smaller. Thus, on the side of the work surface 120 where the substrate is positioned, the distance 134 may be about 1-5 mm, while on the opposite side of the work surface 120 the distance 134 may be about 0.3-3 mm.

The magnets 118 and 108 are each made of a magnetically permeable material that supports an intense magnetic field when energized by current-carrying coils. Such materials are well-known in the art, and include iron, ferrite, mu-metal, metglas, and the like. Permeability of the magnetic core material of the poles 118A/B and 108A/B may be adjusted to direct magnetic field lines toward the work surface, if desired. Magnetic flux follows low reluctance pathways through a core material, so a magnetic flux guide of sorts may be constructed within a core material by creating local variations in magnetic permeability. For instance, if it is desired to create an asymmetrical magnetic field between the two poles 118A and 118B, with a local flux node closer to the work surface than an axis of the poles 118A and 118B, the poles 118A and 118B made with a varying magnetic permeability that is higher close to the work surface and lower far from the work surface. The poles may, for example, be constructed from an iron material, for example an iron alloy, that has a doping profile of nickel, carbon, molybdenum, or other materials that have strong effects on magnetic permeability of iron alloys. The poles of an iron electromagnet core, for example, may be subjected to a doping process wherein a portion of the face of each pole is doped with a selected concentration of nickel to increase the local magnetic permeability, and the magnetic flux through those regions of the pole faces. In some embodiments, a magnetic shunt may be included at any portion of the core to adjust local reluctance and/or field flux.

FIG. 1D is a close side view of a magnet assembly 150 with magnets 152 and 154 arranged similar to the arrangement of FIGS. 1A-1C. The magnets 152 and 154 have shaped poles 152A/B and 154A/B to facilitate projecting a greater magnetic energy density toward the work surface 120 and into a substrate positioned on the work surface 120. In the embodiment of FIG. 1D, the poles 152A/B and 154A/B are beveled similar to the bevels of a mitre magnet. The bevels yield faces of the poles 152A/B and 154A/B that are angled toward the work surface 120.

The field lines of the fringe magnetic fields produced by the magnets in FIGS. 1A-1D curve with a curvature that attains an orientation substantially parallel to the work surface 120 near a maximum field density point between two opposite magnetic poles. To create a substantially uniform magnetic field within a substrate disposed on the work surface 120, the spacing, geometry, and magnetic properties of the poles may be adjusted to create uniform, substantially parallel field lines within the treatment zone 130, although substantial non-uniformity persists as the field lines curve toward the poles 152A/B and 154A/B.

Also illustrated in the embodiment of FIG. 1D are adjustments to the composition of the magnetic poles 152A/B and 154A/B to adjust the magnetic flux toward the work surface 120. In each magnetic pole 152A/B and 154A/B, a region R is formed with enhanced magnetic permeability. The region R may be formed in one embodiment by implanting the region with a permeability enhancing material. For example, molybdenum may be implanted into a permalloy core to create regions of composition approaching that of mu metal, which has higher permeability than permalloy. In this way, the regions R may have magnetic permeability up to twice that of the rest of the magnetic core, resulting in enhanced magnetic flux toward the work surface 120.

The region R may be formed as a section of the core, such that the region R has a diameter that is substantially the same as a diameter of the core, or the region R may be formed as a local region of the core, as shown in FIG. 1D. If the region R is formed as a section of the core having substantially the same diameter, the region R may have an axial dimension that is constant or varied. Varying the axial dimension of the region R across the diameter of the region R allows the magnetic flux between the poles 152A/B and 154A/B to be varied. For example, a thicker enhanced permeability portion near the treatment zone 130 may allow concentration of magnetic flux density within a substrate positioned on the work surface. The region R may be a magnetic shunt in some embodiments.

Electromagnetic energy for annealing or thermal processing emitted by the electromagnetic energy source 102, as modified by the optical system 104, emerges as a uniform shaped energy field propagating as a beam or pulse at 122. The energy propagates through the space between the poles 118A/B of the magnet 118 positioned on the same side of the work surface 120 as a substrate positioned on the work surface 120, and illuminates the treatment zone 130 with energy in the presence of the magnetic field produced by the magnets 118 and 108. The electromagnetic energy is typically intense light such as laser light or high luminosity LED emissions and may have a power density distribution with standard deviation less than about 10%. The electromagnetic energy typically has an energy density between about 0.1 J/cm$^2$ and about 2 J/cm$^2$, such as between about 0.3 J/cm$^2$ and about 1.0 J/cm$^2$, for example about 0.4 J/cm$^2$.

The electromagnetic energy may be pulsed or continuous-wave energy, and may be delivered at any convenient power level for increasing the temperature of a substrate. For pulsed embodiments, the electromagnetic energy is typically delivered at power levels between about 100 KW and about 100 MW, depending on the die size and the substrate properties. In a pulsed embodiment, the pulses may have duration between about 0.1 nsec and about 1 msec, for example about 50 nsec. In one embodiment, pulses having duration of about 26 nsec are delivered at a power of about 50 MW.

Permanent magnets may be used, if desired, in place of electromagnets. A magnetic field between about 0.5 T and about 1.5 T is useful for most embodiments, and such fields are known to be achievable using various rare-earth materials, such a neodymium or cobalt-samarium. Stronger fields may be generated using electromagnets, if desired. Electromagnets also offer the advantage that the field strength may be adjusted, if desired, by controlling power to the magnet. Such adjustment may be useful in annealing of magnetic materials that may have varying magnetic properties and for which adjustment of the field strength is desirable.

Figure 2A:
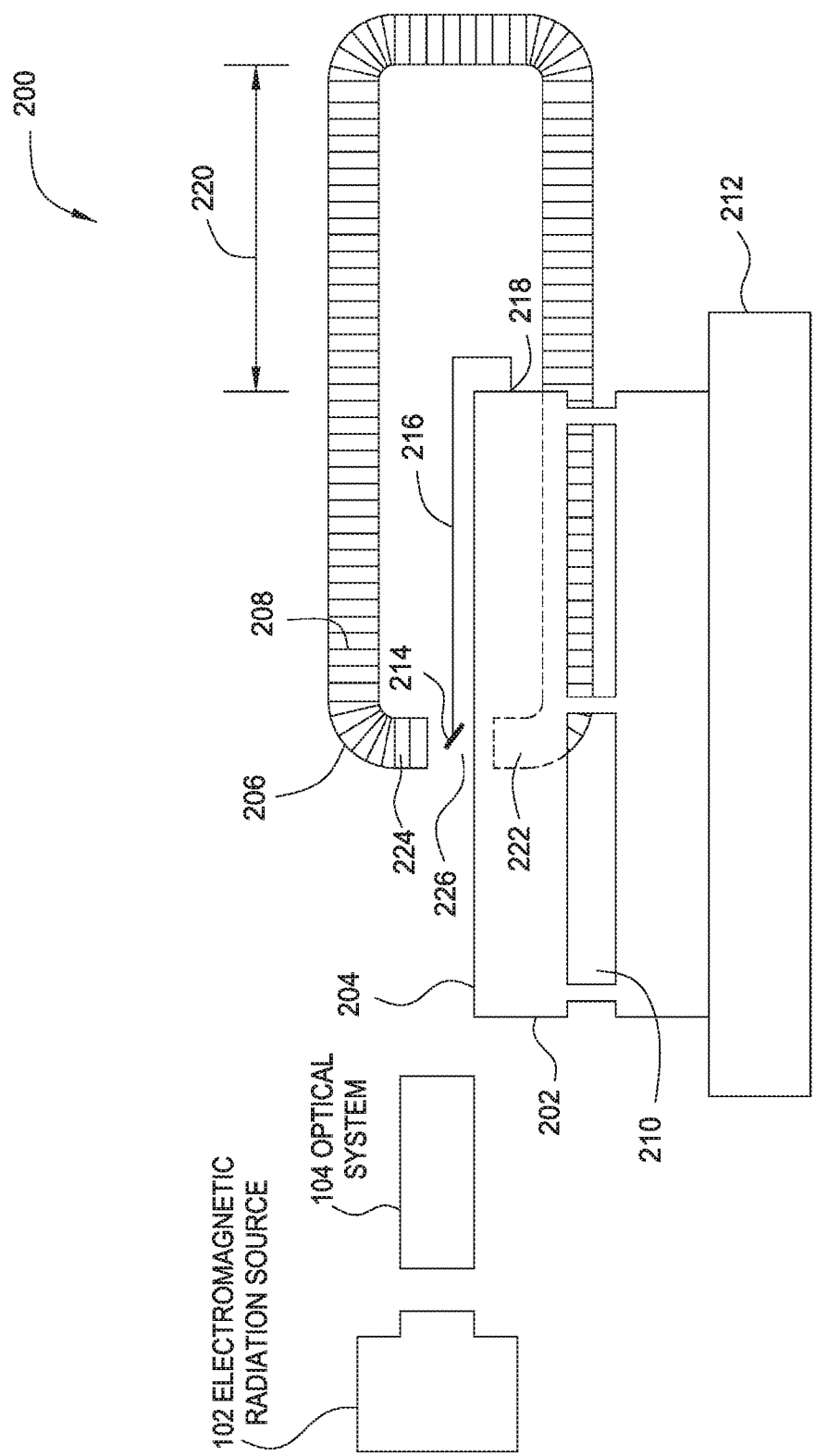
FIG. 2A is a side view of a magneto-thermal processing apparatus according to another embodiment.

FIG. 2A is a schematic side view of a magnetic annealing apparatus 200 according to another embodiment. Whereas the embodiment of FIGS. 1A-1D produces a magnetic field substantially parallel to the work surface 120, the embodiment of FIG. 2A produces a magnetic field substantially perpendicular to a work surface 204 of the apparatus 200. Magnetic poles 224 and 222, of opposite magnetic polarity, are disposed on opposite sides of the work surface 204 to project the magnetic field through a treatment area 226.

The magnetic field is produced by a magnet 206, which may be a permanent magnet or an electromagnet. Whereas in the embodiments of FIGS. 1A-1D, two magnets are used to generate a magnetic field proximate the work surface 120, one magnet 206 may be used for the embodiment of FIG. 2A. The magnet 206 comprises a core 230 and one or more conductive coils 208.

A waveguide 214 is disposed between the magnetic pole 224 and the work surface 204, typically between the magnetic pole 224 and the treatment area 226. The waveguide 214 directs electromagnetic radiation onto a substrate disposed on the work surface 204. The waveguide 214 may be of any convenient design, including reflectors, for example mirrors or retroreflectors, partial reflectors, refractors, fibers, and the like. Multiple waveguides may be used, if desired, to produce a particular energy field. The waveguide 214 is supported by a support 216 that attaches to a stationary fixture of the apparatus 200, such as a chamber wall 218. The support 216 may also attach to the chamber floor or to the magnet 206, or a support for the magnet.

A substrate is disposed on the work surface 204, which is an upper surface of a substrate support 202. The substrate support 202 is movable on a stage 212 that positions the substrate support 202 such that desired locations on the substrate may be exposed to the magnetic field and the electromagnetic energy propagating from the waveguide 214 to the work surface 204. The waveguide 214 is supported from a stationary fixture of the apparatus 200 so that as the substrate support 202 moves, the waveguide 214 remains unmoved relative to the electromagnetic energy emitted by the energy source 102 and transmitted by the optical assembly 104.

The pole 222 is positioned on the opposite side of the work surface 204 from the pole 224, so the magnetic field propagates through the work surface 204. The portion of the magnet that culminates in the pole 222 projects through openings 210 in the substrate support 202 that allow the pole 222 to access the opposite side of the work surface 204. As the substrate support 202 moves, the substrate positioned on the work surface 204 is translated between the poles 224 and 226, exposing successive locations of the substrate to the magnetic field. The magnet 206 comprises an extension 220 that allows the substrate support 202 to translate freely while avoiding collisions with the magnet 206. In some embodiments, the magnet 206 may have poles 224 and 222 that encompass the substrate support 202 and the stage 212, if desired. As described above in connection with FIGS. 1A-1D, a single coil 208 may be used, or multiple coils 208 may be used.

Figure 2B:
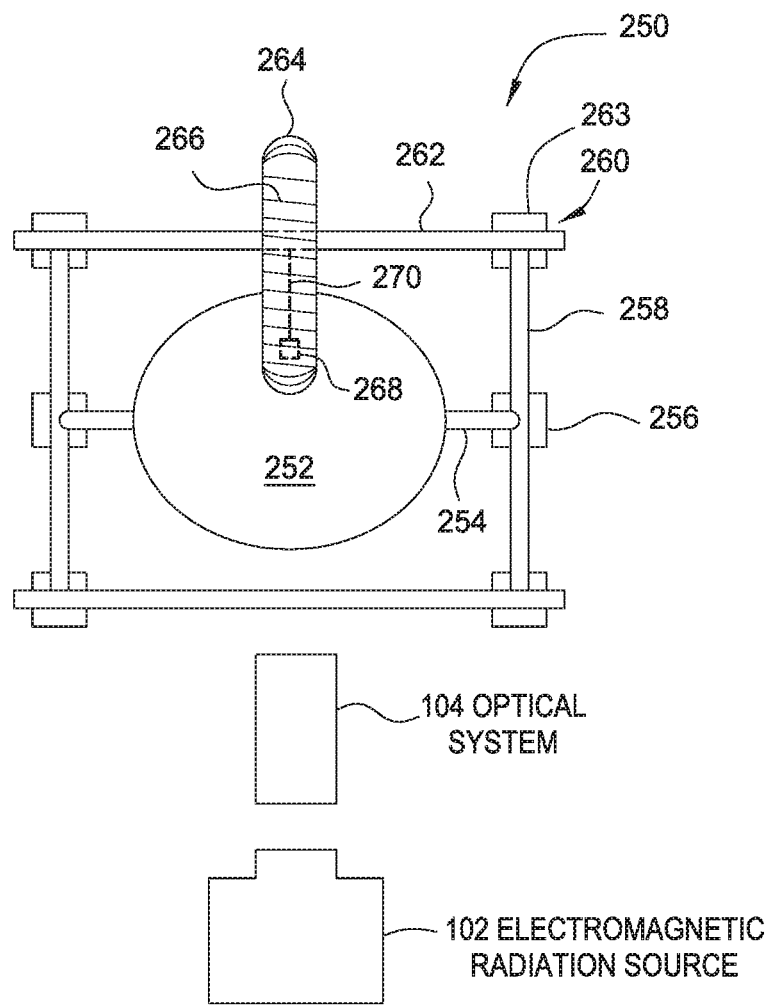
FIG. 2B is a top view of the magneto-thermal processing apparatus of FIG. 2A.

FIG. 2B is a top view of an apparatus 250, according to another embodiment. The apparatus 250 is a magnetic thermal processing apparatus comprising an energy source 102, which may be an optical source such as a laser, LED, or other superluminescent source. An optical assembly 104 may be used to form a desired propagating energy field.

A substrate support 252 is coupled to a positioning gantry 260, which comprises rails 258 coupled to rails 262 by carriage 263. The substrate support is coupled to the rails 258 by struts 254 and carriage 256. The rails and carriages are typically motorized to facilitate precision x-y positioning of a substrate positioned on the substrate support 252.

A magnet assembly 264 provides a local magnetic field proximate to, and permeating through, a treatment zone of the substrate support 252, which is obscured in the view of FIG. 2B by the magnet assembly 264 The magnet assembly 264 has a first pole proximate a first surface of the substrate support 252, visible in the view of FIG. 2B, and a second pole proximate a second surface of the substrate support 252 opposite the first surface, and obscured by the substrate support 252 in the view of FIG. 2B. The two poles of the magnet assembly 264 produce a magnetic field substantially perpendicular to the substrate support 252 and to a substrate disposed on the substrate support 252. The perpendicular magnetic field permeates the substrate on the substrate support 252 during thermal process. The magnet assembly 264 extends beyond the positioning gantry 260 to allow the substrate support 252 to move freely between the two poles of the magnet assembly 264 such that all desired treatment zones of the substrate may be processed by the magnetic field and the thermal energy. In FIG. 2B, the magnet assembly 264 is depicted as an electromagnet, with current-carrying coil 266, which is typically coupled to a power source (not shown). The magnet assembly 264 may have a permanent magnet in some embodiments. As described above, the magnet assembly 264 produces a magnetic field of between about 0.5 T and about 3.0 T, such as between about 1.0 T and about 2.0 T, for example about 1.5 T.

A waveguide 268 is positioned between the first pole of the magnet assembly 264 and the substrate support 252. As described above, the waveguide 268 may be any device for directing electromagnetic energy, such as a mirror, retroreflector, fiber, lens, prism, or other such device, or a combination of such devices. The waveguide 268 directs electromagnetic energy from the optical assembly 104 toward the substrate support 252. The waveguide 268 is supported by a support 270 anchored to a reference that remains relatively stationary with respect to the magnet assembly 264 and the energy source 102. The waveguide 268 may be positioned entirely within the magnetic field of the magnet assembly 264, or may be partially outside the magnetic field in some embodiments.

In operation, a substrate is disposed on the substrate support 252, and the positioning gantry 260 initialized to a first position for processing a first treatment zone. In an electromagnet embodiment, the magnetic field is established and stabilized by powering the magnet, and then the energy source 102 is powered to produce an electromagnetic energy field that projects thermal energy into and through the magnetic field by operation of the waveguide 268. The thermal energy and the magnetic field energy impact the treatment zone of the substrate to process the treatment zone according to a desired electromagnetic profile.

It should be noted that, in some embodiments, the thermal energy field may be established before applying the magnetic field. Such embodiments typically use low power thermal energy, so that processing times are sufficiently long to compensate for the time required to establish a magnetic field using an inductive device like an electromagnet. The thermal energy and/or the magnetic field may be pulsed and/or cycled in any desired way. For example, the magnetic field may be established, and then a train of electromagnetic energy pulses applied through the magnetic field to the treatment zone according to any desired pattern.

The apparatus described herein may be used to practice methods of thermal processing in the presence of a magnetic field. Such methods may be useful in annealing of magnetic materials to produce magnetically active materials that are oriented and/or magnetized to any desired degree. Magnetically inactive materials may also be annealed more effectively in some cases by coupling the magnetic field to the structures, impurities, and/or defects to be annealed.

A substrate is disposed on a substrate support in an apparatus capable of applying thermal energy and magnetic energy to a treatment zone of the substrate. The substrate may be a semiconductor substrate to be processed by a magneto-thermal process, for example a silicon substrate to be annealed in the presence of a magnetic field. The substrate may also be a magnetic media substrate having a magnetically active layer to be processed by a magneto-thermal process. The treatment zone may be a portion of the substrate that is about 10 cm$^2$ or less.

A local magnetic field is established that permeates the treatment zone of the substrate, and thermal energy is applied to the treatment zone in the presence of the magnetic field. The magnetic field may have an intensity between about 0.1 T and about 3.0 T, such as between about 0.5 and about 2.0 T, for example about 1.5 T, and may be generated by any method described elsewhere herein. The magnetic field is typically confined to a cross-sectional area similar in size to the treatment zone to reduce the apparatus size and power. For example, the treatment zone having an area of about 10 cm$^2$ or less is subjected to a magnetic field during processing, while areas outside the treatment zone are outside the magnetic field.

The magnetic field may be oriented substantially parallel to the substrate surface, substantially perpendicular to the substrate surface, or at any desired angle with respect to the substrate surface, depending on the needs of particular processes. For processes that orient the magnetic moments of a magnetically active material, a perpendicular or horizontal orientation is usually selected. For processes that couple the magnetic field to specific features of the substrate material, an angled orientation may be selected. The apparatus described above in connection with FIGS. 1A-2B may be used to establish oriented magnetic fields.

In some embodiments, the angle of the magnetic field may be changed, cycled, or precessed according to a pattern to achieve specific results with respect to cycling the orientation of magnetic moments or structural features of the substrate material. For example, structural defects in a silicon substrate have a slight dipole moment that may be perturbed by a magnetic field, reducing the thermal energy needed to anneal the defect. Such defects are typically oriented randomly within the material, so cycling the magnetic field through different orientations may be effective to maximize perturbation of structural defects and the annealing thereof. The apparatus of FIGS. 1A-1D may be oriented by attaching the magnetic assemblies thereof to an actuated support that rotates the magnets as needed to angle the orientation of the magnetic field.

In one type of process, one or more magnetic pulses may be delivered during a thermal process. Thus, the thermal energy may be applied, and then a pulse of magnetic energy applied when the substrate has reached a desired thermal state. In one embodiment, a pulse of magnetic energy may be applied after the treatment zone reaches a target treatment temperature. Such a pulse will necessarily have duration less than a duration of the target treatment temperature, so if the target treatment temperature has a duration less than 1 sec, the magnetic pulse may have a duration less than 0.5 sec. Such a process may be followed, for example, if the desired outcome is to have a magnetically active material with oriented magnetic domains.

In another type of process, one or more pulses of thermal treatment energy may be delivered while the treatment zone is subjected to an established magnetic field. Thus, the magnetic field is established, and one or more pulses of thermal energy delivered to the treatment zone. In such a process, the magnetic field may be continuously applied while successive treatment zones are positioned within the magnetic field for magneto-thermal process. The thermal pulses may be delivered by flash lamps or by superluminescent sources such as LED's, lasers, and other gain discharge devices. Pulses may be delivered at energy densities between about 0.2 J/cm$^2$ and about 2.0 J/cm$^2$ over durations from about 0.1 nsec to 1 sec. Pulse trains may also be delivered, wherein multiple pulses of thermal energy are delivered repeatedly to the treatment zone immersed in the magnetic field. Such processes may be used, for example, in annealing of semiconductor substrates to enhance coupling of annealing energy into crystal defects that have slight electric dipole moments. Such processing may also be useful for processing substrates that have semiconductive and magnetically active materials in different treatment zones of the substrate. The magnetically active zones may be processed according to a process designed to orient, or otherwise affect, magnetic domains of the magnetically active zones, and the semiconductive zones may be processed according to a process designed to anneal, or otherwise improve, the crystal structure of the semiconductive zones. Such a process may be performed on an entire substrate without interruption merely by adjusting the process conditions for the characteristics of each treatment zone of the substrate.

Magneto-thermal processing delivers a combined magneto-thermal field to a substrate for enhanced processing. The magneto-thermal field improves coupling of energy into substrates with features that have magnetic dipole and/or electric dipole domains. Simultaneously coupling magnetic energy, thermal, and radiant energy allows a variety of manipulations that may be tailored to the substrate for best results. Delivering a localized magneto-thermal field, moreover, enables increased precision, power, and uniformity across a substrate at lower overall energy budget.

While the foregoing is directed to embodiments of the present invention, other and further embodiments of the invention may be devised without departing from the basic scope thereof, and the scope thereof is determined by the claims that follow.

The invention claimed is:

1. An apparatus for magneto-thermal processing of substrates, comprising:
a substrate support positionable in three orthogonal directions;
a source of electromagnetic radiation that delivers an electromagnetic field of density at least about 0.2 J/cm$^2$ and cross-sectional area not more than about 10 cm$^2$ to an area of the work surface; and
a magnetic assembly that delivers a magnetic field of at least about 0.5 T having an area not more than about 10 cm$^2$ to the area of the work surface in an orientation substantially parallel to the work surface or substantially perpendicular to the work surface, wherein the magnetic field is between about 1.5 T and about 3.0 T in an area not more than about 10 cm$^2$.

2. The apparatus of claim 1, wherein the source of electromagnetic radiation comprises a plurality of pulsed lasers, a pulse combiner, and a homogenizer.

3. An apparatus for annealing substrates, comprising:
a work surface positionable in three orthogonal directions;
a source of electromagnetic radiation that delivers an electromagnetic field of density at least about 0.2 J/cm$^2$ and cross-sectional area not more than about 10 cm$^2$ to an area of the work surface; and
a magnetic assembly that delivers a magnetic field of at least about 0.5 T having an area not more than about 10 cm$^2$ to the area of the work surface, wherein the electromagnetic field is delivered to a first surface of the work area, and the magnetic assembly comprises a first magnetic pole facing the first surface of the work area and a second magnetic pole facing a surface of the work area opposite the first surface, and further comprising a reflector positioned between the first magnetic pole and the work surface.

4. The apparatus of claim 3, further comprising a third magnetic pole facing the first surface of the work area, and a fourth magnetic pole facing the surface of the work area opposite the work surface.

5. The apparatus of claim 3, wherein the source of electromagnetic radiation is a laser assembly.

6. The apparatus of claim 5, wherein the laser assembly comprises a plurality of pulsed lasers.

7. The apparatus of claim 5, wherein the magnetic assembly comprises an exposure pathway for laser light through the magnetic field to the work surface.

8. The apparatus of claim 5, wherein the magnetic field of at least about 0.5 T has a cross-sectional area larger than the cross-sectional area of the energy field.

9. The apparatus of claim 3, wherein the magnetic field is oriented substantially perpendicular to the work surface or substantially parallel to the work surface.

10. The apparatus of claim 9, wherein the magnetic field is oriented substantially parallel to the work surface, and the magnetic assembly comprises a first magnet proximate a first side of the work surface, and a second magnet proximate a second side of the work surface opposite the first side of the work surface.

11. The apparatus of claim 10, wherein the electromagnetic field propagates between two poles of the first magnet to the work surface.

12. The apparatus of claim 11, wherein the magnetic field is substantially parallel to the work surface within the area of the work surface.

13. An apparatus for magneto-thermal processing of substrates, comprising:
 a substrate support positionable in three orthogonal directions;
 a source of electromagnetic radiation that delivers an electromagnetic field of density at least about 0.2 J/cm$^2$ and cross-sectional area not more than about 10 cm$^2$ to an area of the work surface; and
 a magnetic assembly that delivers a magnetic field of at least about 0.5 T having an area not more than about 10 cm$^2$ to the area of the work surface in an orientation substantially parallel to the work surface or substantially perpendicular to the work surface, wherein the magnetic assembly comprises a magnet with a first magnetic pole proximate to a first surface of the substrate support and a second magnetic pole proximate to a second surface of the substrate support opposite the first surface, and further comprising a reflector positioned between the first magnetic pole and the first surface.

14. The apparatus of claim 13, wherein the magnetic assembly comprises a first magnet with two magnetic poles positioned proximate a first surface of the substrate support and a second magnet with two magnetic poles positioned proximate a second surface of the substrate support opposite the first surface.

15. The apparatus of claim 14, wherein the magnetic poles have a shape that projects magnetic force into the substrate support.

16. The apparatus of claim 13, wherein the reflector is a cylindrical dielectric mirror.

* * * * *